US006083664A

United States Patent [19]

Inno et al.

[11] Patent Number: 6,083,664

[45] Date of Patent: Jul. 4, 2000

[54] METHOD FOR PRODUCING PLANOGRAPHIC PRINTING PLATE

[75] Inventors: Toshifumi Inno; Masahiko Fukaya, both of Shizuoka-ken, Japan

[73] Assignee: Fuji Photo Film Co., Ltd., Minami-Ashigara, Japan

[21] Appl. No.: 09/225,506

[22] Filed: Jan. 6, 1999

[30] Foreign Application Priority Data

Jan. 16, 1998 [JP] Japan .................................. 10-007063

[51] Int. Cl.$^7$ ...................................................... G03F 7/004

[52] U.S. Cl. ........................... 430/302; 430/331; 430/435

[58] Field of Search .............................. 430/271.1, 272.1, 430/303, 435, 302, 331

[56] References Cited

U.S. PATENT DOCUMENTS

| | | | |
|---|---|---|---|
| 4,963,472 | 10/1990 | Schlosser et al. | 430/303 |
| 5,260,167 | 11/1993 | Sasa et al. | 430/272 |
| 5,334,486 | 8/1994 | Abe et al. | 430/288 |
| 5,786,125 | 7/1998 | Tsuchiya et al. | 430/272.1 |
| 5,871,883 | 2/1999 | Hirano et al. | 430/272.1 |
| 5,958,652 | 9/1999 | Suezawa et al. | 430/303 |

FOREIGN PATENT DOCUMENTS

| | | |
|---|---|---|
| 573091 | 12/1993 | European Pat. Off. . |
| 50-158405 | 12/1975 | Japan . |

*Primary Examiner*—Janet Baxter

*Assistant Examiner*—Barbara Gilmore

*Attorney, Agent, or Firm*—Burns, Doane, Swecker & Mathis, LLP

[57] ABSTRACT

A method for producing a planographic printing plate comprising the steps of: producing an original planographic printing plate which comprises a substrate, and a first layer and an ink-repellent layer having an ink-repellent surface in that order on said substrate, wherein the first layer converts laser light to heat and enables peeling of upper layers disposed on said first layer; exposing said original planographic printing plate by laser light; and rubbing the surface of said original planographic printing plate, which is the surface of said ink-repellent layer, with a rubbing member in the presence of an aqueous solution containing a nonionic surfactant to physically remove laser-exposed portions of said ink-repellent layer, thereby forming the planographic plate, is provided.

5 Claims, 2 Drawing Sheets

METHOD FOR PRODUCING PLANOGRAPHIC PRINTING PLATE

BACKGROUND OF THE INVENTION

1. Field of the Invention

The present invention relates to a method for producing a planographic printing plate by way of heat mode recording such as by laser light or the like.

2. Description of the Related Art

Recently, in the production of planographic offset printing plates which are widely used in the printing field, attention has been focused on a technique in which a plate production step which is carried out before a printing step is digitized, such that a printing plate is directly formed by laser writing from digital data without the writing being carried out through a lithographic film. For printing of a small number of copies, a waterless planographic printing plate having an ink-repellent layer formed of silicone rubber is suitable since it does not require skill in the printing work. The following various methods have been known for producing a planographic printing plate having an ink-repellent layer by direct laser writing.

For example, EP-0573091B discloses a method in which a plate material having a silicone rubber surface layer is exposed by a YAG laser, and the exposed portions are rubbed off under a dry condition without solvent or are rubbed off while applying a solvent which does not swell silicone rubber, so as to form a waterless plate.

However, when the physical removal of the silicone rubber at the laser-exposed portions by rubbing is conducted under a dry condition, the silicone rubber removed from the exposed portions (i.e., silicone rubber refuse) tends to adhere to the silicone rubber layer at the non-image portions or to the image portions from which the silicone rubber layer has been removed. Further, the silicone rubber layer at the non-image portions tends to be scratched. Therefore, when printing is conducted by using a waterless planographic plate formed by this method, there are the drawbacks that the non-image portions are scratched and stained, and that lack of images is formed at the image portions.

Regarding adhesion of the silicone rubber refuse to the surface of a plate, it is known that there is less adhesion when the physical removal of the silicone rubber at the laser-exposed portions is conducted in the presence of a liquid. For example, Japanese Patent Application Laid-Open (JP-A) No. 50-158405 discloses a method in which a printing original plate having a surface layer of silicone rubber is exposed by a YAG laser which is an infrared laser, and the laser-exposed portions are removed by a solvent (naphtha) treatment (and rubbing) so as to form a planographic plate.

However, when a liquid which swells silicone rubber (for example, a liquid containing as a main component a hydrocarbon-based solvent such as naphtha) is used as the liquid for removal, a drawback arises in that the silicone rubber layer at the non-image portions tends to be scratched even more since the film strength of the silicone rubber decreases.

Therefore, it is suitable to use a liquid which does not swell the silicone rubber layer for the rubbing treatment. Examples of liquids which do not swell the silicone rubber layer are polar solvents such as water, alcohols and the like. However, when a polar solvent is used alone, adhesion of the silicone rubber refuse to the surface of the plate is not sufficiently prevented since the ability of a polar solvent to wet the silicone rubber layer is poor.

In order to improve the ability of the polar solvent to wet the silicone rubber layer, it is effective to add a surfactant to the polar solvent.

On the other hand, when the silicone rubber layer at the laser-exposed portions is removed physically to produce a planographic printing plate on which an image is reproduced uniformly, it is conventional to use an automatic treating machine equipped with a rubbing member.

However, when a liquid containing a surfactant is used in the automatic treating machine, problems arise due to bubbling, such as the generation of bubbles between the rubbing member and the surface of the plate, the generation of bubbles in the treating solution tank, an increase in the load of a liquid feeding pump, which supplies the liquid to the rubbing member and the surface of the plate, due to bubbles entering into the pump, and the like.

SUMMARY OF THE INVENTION

The present invention has been accomplished to solve the above-described conventional drawbacks.

An object of the present invention is to provide a method for producing a planographic printing plate which can be prepared by using laser light, and in which exposed portions of an ink-repellent layer can be removed, and which enables excellent printing. Another object of the present invention is to provide a method for producing a planographic plate which does not cause bubbling of a liquid used in the rubbing treatment of the plate by a rubbing member, and thus does not cause problems resulting from such bubbling.

In order to solve the above-described drawbacks and achieve the above-described object, the present invention provides a method for producing a planographic printing plate comprising the steps of: producing an original planographic printing plate which comprises a substrate, and a first layer and an ink-repellent layer having an ink-repellent surface in that order on the substrate, wherein the first layer coverts laser light to heat and enables peeling of upper layers disposed on the first layer; exposing the original planographic printing plate by laser light; and rubbing the surface of the original planographic printing plate, which is the surface of the ink-repellent layer, with a rubbing member in the presence of an aqueous solution containing a nonionic surfactant to physically remove laser-exposed portions of the ink-repellent layer, thereby forming the planographic plate.

DESCRIPTION OF THE PREFERRED EMBODIMENTS

Figure 1:
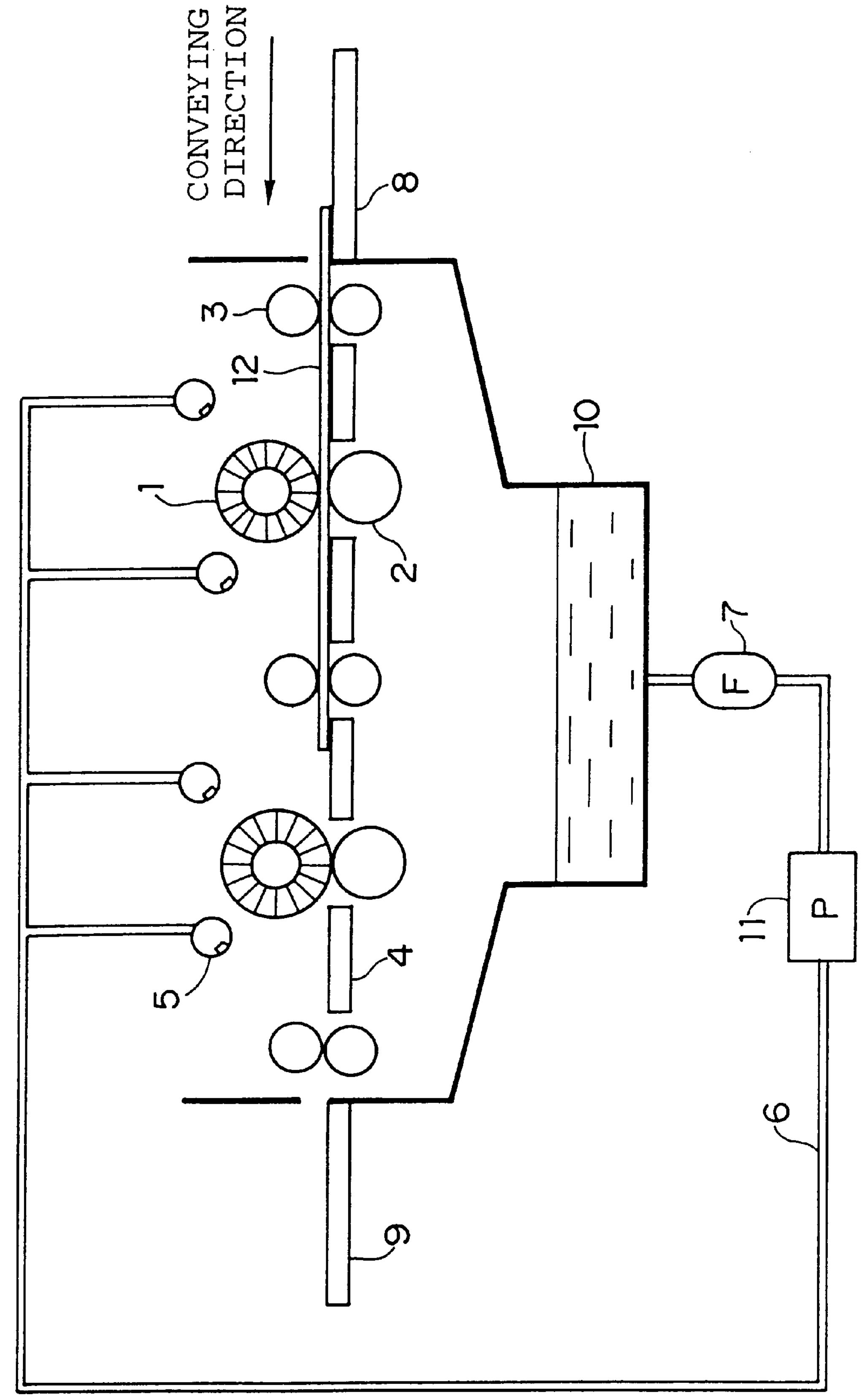
FIG. 1 is a schematic view for explanation of a first embodiment of the method for producing a planographic printing plate of the present invention.

In the method for producing a planographic printing plate of the present invention, a planographic printing original plate comprises a substrate, and a first layer and an ink-repellent layer having an ink-repellent layer (hereinafter, the ink-repellent layer is referred to as "the second layer") in that order on the substrate. The first layer converts laser light to heat and enables peeling of upper layers disposed on the first layer due to the heat. The planographic printing original plate is exposed by a laser. Then, the surface of the ink-repellent layer is rubbed by using a rubbing member in the presence of an aqueous solution containing a nonionic surfactant so as to physically remove the laser-exposed portions of the ink-repellent layer. The method for producing a planographic printing plate of the present invention can be suitably conducted by using an automatic treating machine equipped with the rubbing member.

(Substrate)

The substrate which is used may be formed from any of well-known metals, plastic films, or paper usually used for offset printing, or may be formed from a composite of such materials. It is preferable that the substrate has physical abilities such as mechanical strength, elongation resistance and the like required under the printing conditions used.

The substrate may be a substrate formed of a metal such as aluminum; a substrate formed of a plastic such as polyethylene terephthalate, polyethylene naphthalate, polycarbonate or the like; paper; a composite sheet obtained by laminating a plastic film such as polyethylene, polypropylene or the like on paper; or the like.

The thickness of the substrate is not unconditionally defined since the optimal value varies depending on the types of material, the printing conditions and the like of the substrate. The thickness of the substrate is usually from about 25 $\mu$m to 3 mm, preferably from 75 to 500 $\mu$m, and more preferably from 100 to 300 $\mu$m.

The substrate may be subjected to a surface treatment such as corona treatment or the like, or a primer layer can be provided thereon, in order to improve the adhesion with the adjacent layers such as the first layer formed on the substrate, or in order to improve the printing properties or increase the sensitivity.

Examples of the primer layer include: a layer obtained by exposing any of various photosensitive polymers disclosed in JP-A No. 60-22903 to cure this layer before lamination of the above-described second layer; a layer obtained by thermally curing any of the epoxy resins disclosed in JP-A No. 62-50760; a layer obtained by curing a gelatin disclosed in JP-A No. 63-133151; a layer obtained by using a urethane resin and a silane coupling agent disclosed in JP-A No. 3-200965; a layer obtained by using a urethane resin disclosed in JP-A No. 3-273248;, and the like. In addition, a layer obtained by curing gelatin or casein is also effective.

Further, polymers such as polyurethane, polyamide, styrene/butadiene rubber, carboxy modified styrene/butadiene rubber, acrylonitrile/butadiene rubber, carboxy modified acrylonitrile/butadiene rubber, polyisoprene, acrylate rubber, polyethylene, chlorinated polyethylene, chlorinated polypropylene, vinyl chloride/vinyl acetate copolymer, nitrocellulose, halogenated polyhydroxystyrene, chlorinated rubber, and the like may be added to the above-described primer layer. The addition ratio thereof is not particularly restricted and may be any arbitrary value. Further, it is possible to form the primer layer only from such additives, provided that a film layer can indeed be formed.

Further, the primer layer can also contain additives such as adhesion assistants (for example, a polymerizable monomer, a diazo resin, a silane coupling agent, a titanate coupling agent, an aluminum coupling agent or the like), or dyes, or the like. Further, the primer layer may be cured by exposure after being coated.

The primer layer is also useful as an ink-receptive layer at the portions at which the ink-repellent layer has been removed, and is particularly useful when the substrate is a non-ink-receptive layer such as a metal substrate.

Also, the primer layer serves as a cushion layer for buffering pressure applied to the ink-repellent layer during printing.

The primer layer is coated such that the coated amount thereof when dry is usually from 0.05 to 10 g/m$^2$, preferably from 0.1 to 8 g/m$^2$, and more preferably from 0.2 to 5 g/m$^2$.

(First layer)

The first layer is a layer which converts laser light to heat (light-heat conversion) and enables release of an upper layers disposed on the first layer due to the heat. The first layer contains a light-heat conversion material, and if necessary, other components such as a binder, additives, and the like.

Light-heat conversion material

When the laser light source is an infrared laser, any of various organic and inorganic materials which absorb light having wavelengths used for the writing laser may be used as the above-described light-heat conversion material. Examples of such materials are infrared absorption dyes, infrared absorption pigments, infrared absorption metals, infrared absorption metal oxides, and the like.

These materials may be used as a film which contains only the material(a "single-component film"), or may be used in a mixed film which contains a binder, additives, or the like in addition to the material.

The single-component film can be formed on the substrate by depositing a metal such as aluminum, titanium, tellurium, chromium, tin, indium, bismuth, zinc, lead, or the like, or an alloy, a metal oxide, a metal carbide, a metal nitride, a metal boride, a metal halide, an organic dye, or the like, by a vapor deposition method, a sputtering method or the like.

The mixed film can be formed by dissolving or dispersing the above-described light-heat conversion material together with other components in a solution and coating the resulting solution on a substrate, or the like.

As the light-heat conversion material, there can be used any of various carbon blacks such as acidic carbon blacks, basic carbon blacks, neutral carbon blacks and the like which are organic pigments; any of various carbon blacks whose surface is modified or coated for improving dispersibility; nigrosine; any of the organic dyes described in "Infrared Sensitizing Dyes" (Matsuoka, Plenum Press, New York, NY (1990)); any of various compounds described in U.S. Pat. No. 4,833,124, EP-321923, U.S. Pat. Nos. 4,772,583, 4,942,141, 4,948,746, 4,948,777, 4,948,778, 4,950,639, 4,912,083, 4,952,552 and 5,023,229, and the like; aluminum, indium tin oxide, tungsten oxide, manganese oxide, titanium oxide or the like which are metals or metal oxides; polypyrrole, polyaniline or the like which are conductive polymers; and the like.

Binder

When the above-described first layer is formed by such a mixed film, known binders which dissolve or disperse the light-heat conversion materials can be used as the binder. Examples of such binders include cellulose and cellulose derivatives such as nitrocelluose, ethylcellulose and the like; homopolymers and copolymers of acrylate esters and methacrylate esters such as polymethyl methacrylate, polybutyl methacrylate and the like; homopolymers or copolymers of styrene-based monomers such as polystyrene, a-methylstyrene and the like; various synthetic rubbers such as isoprene, styrene-butadiene and the like; homopolymers of vinyl esters such as polyvinyl acetate and the like and copolymers of vinyl esters such as vinyl acetate-vinyl chloride and the like; various condensation-type polymers such as polyurea, polyurethane, polyester, polycarbonate, and the like; and binders used for so-called "chemical amplification systems" described in Frechet et al., "J. Imaging Sci.", 30(2)(1986), pp.59–64; Ito and Willson, "Polymers in Electronics" in *Symposium Series,* 242 (1984), (T. Davidson, Ed.), ACS, Washington DC, p.11; and E. Rechmanis and L. F. Thompson, "Microelectronic Engineering", 13(1991), pp.3–10.

Additive

When the first layer is formed by a mixed film, additives can be used in addition to the light-heat conversion material and the binder. The additives are added in accordance with various objects such as improvement of the mechanical strength of the first layer, improvement of laser recording sensitivity, improvement of the dispersibility of a material to be dispersed in the light-heat conversion layer, and/or improvement of adhesion to adjacent layers such as the substrate, primer layer, and the like.

For example, for improving the mechanical strength of the first layer, a means for crosslinking the first layer may be contemplated. In this case, any of various crossing agents can be added.

For improving the laser recording sensitivity, a known compound can be added which decomposes and generates a gas in the presence of heat. In this case, the laser recording sensitivity can be improved by sudden volume expansion of the first layer. Examples of such additives include dinitrosopentamethylenetetramine, N,N'-dimethyl-N,N'-dinitrosoterephthalamide, p-toluenesulfonylhydrazide, 4,4-oxybis(benzenesulfonylhydrazide), diamidebenzene, and the like.

Further, a known compound which decomposes and generates an acidic compound in the presence of heat can be used as an additive. Such an additive can be used together with a chemical amplification-based binder to significantly decrease the decomposition temperature of the components of the first layer, which consequently improves the laser recording sensitivity. Examples of these additives include various iodonium salts, sulfonium salts, phosphonium tosylates, oxime sulfonates, dicarbodiimide sulfonates, triazines, and the like.

When a pigment such as a carbon black or the like is used in the light-heat conversion material, the degree of dispersion of the pigment may influence the laser recording sensitivity, and thus, various pigment dispersing agents can be used as additives.

For improving adhesion, a known adhesion improving agent such as a silane coupling agent, a titanate coupling agent or the like may be added.

In addition, if desired, there can be added various additives such as a surfactant for improving the coating property, or the like.

Thickness of first layer

When the first layer is a single-component film, the film can be formed to be thin by a vapor depositing method, sputtering method or the like. In this case, the thickness of the first layer is from 50 to 1000 Å, preferably from 100 to 800 Å. When the first layer is a mixed film, the film can be formed by coating. In this case, the thickness of the first layer is from 0.05 to 10 μm, preferably from 0.1 to 5 μm. If the thickness of the first layer is too large, undesirable results occur, such as a reduction in the laser recording sensitivity or the like.

(Second layer)

The second layer is an ink-repellent layer having a surface which is ink-repellent.

The raw material of the second layer may be a conventionally known material having a surface which is ink-repellent, such as fluorine or a silicone compound or the like, which are substances having low surface energy. In particular, silicone rubber (silicone elastomer) is preferable.

Silicone rubber is broadly classified into three types: (1) condensation-type silicone rubber, (2) addition-type silicone rubber, and (3) radiation-curing type silicone rubber. Any of various, conventionally-known silicone rubbers can be used as the silicone rubber of the second layer of the waterless original plate in the present invention.

The second layer formed of the condensation-type silicone rubber is a film formed by curing the following composition A.

Composition A

| | | | |
|---|---|---|---|
| (a) | Diorganopolysiloxane | 100 | parts by weight |
| (b) | Condensation-type crosslinking agent | 3 to 70 | parts by weight |
| (c) | Catalyst | 0.01 to 40 | parts by weight |

Component (a), diorganopolysiloxane, is a polymer having a repeating unit represented by —$(R_1)$ $(R_2)$Si—O—, wherein $R_1$ and $R_2$ each represents a substituent bonded to Si, and each represents an alkyl group, vinyl group or aryl group having 1 to 10 carbon atoms, and each may have other suitable substituents. In general, 60% or more of the $R_1$ and $R_2$ preferably is a methyl group, halogenated vinyl group, halogenated phenyl group, or the like.

The diorganopolysiloxane preferably has a hydroxyl group on both ends.

The component (a) may have a number-average molecular weight of 3,000 to 100,000, and preferably of 10,000 to 70,000.

The component (b), condensation-type crosslinking agent, may be any condensation-type crosslinking agent. For example, the condensation-type crosslinking agent represented by the following general formula is preferable:

$R_1$m.Si.$X_n$ (wherein, m+n=4, and n is 2 or more)

Here, $R_1$ has the same meaning as that for $R_1$ explained above. X represents a halogen such as Cl, Br, I or the like; H; or an organic substituent such as OH, $OCOR_3$, $OR_3$, —O—N=C$(R_4)(R_5)$—N$(R_4)(R_5)$ or the like. $R_3$ represents an alkyl group having 1 to 10 carbon atoms or an aryl group having 6 to 20 carbon atoms. $R_4$ and $R_5$ each independently represents an alkyl group having 1 to 10 carbon atoms.

The component (c), catalyst, may be a known catalyst such as a metal carboxylate of, for example, tin, zinc, lead, calcium, manganese or the like, for example, dibutyltin laurate, lead octylate, lead naphthenate chloroplatinic acid, or the like.

The second layer formed of the addition-type silicone rubber is a film formed by curing the following composition B.

Composition B:

| | | | |
|---|---|---|---|
| (d) | Diorganopolysiloxane having an addition reactive functional group | 100 | parts by weight |
| (e) | Organohydrogenpolysiloxane | 0.1 to 25 | parts by weight |
| (f) | Addition catalyst | 0.00001 to 1 | part by weight |

The component (d), diorganopolysiloxane having an addition reactive functional group, is organopolysiloxane having at least two alkenyl groups (more preferably, vinyl groups) directly bonded to a silicon atom in one molecule. The alkenyl groups may exist either at a molecular end or at an intermediate position. The diorganopoly siloxane may contain organic groups in addition to the alkenyl group, such as a substituted or unsubstituted alkyl group or aryl group having 1 to 10 carbon atoms, or the like. Further, the component (d), diorganopolysiloxane having an addition reactive functional group, may have a very small number of hydroxyl groups.

The above-described component (d), diorganopolysiloxane having an addition reactive functional group, may have a number-average molecular weight of 3,000 to 100,000, and more preferably 10,000 to 70,000.

Examples of the component (e), organohydrogenpolysiloxane, include polydimethylsiloxane having hydroxyl groups on both ends, α,ω-dimethylpolysiloxane, methylsiloxane-dimethylsiloxane copolymer having hydroxyl groups on both ends, cyclic polymethylsiloxane, polymethylsiloxane having trimethylsilyl groups on both ends, (dimethylsiloxane having trimethylsilyl groups on both ends)-(methylsiloxane) copolymer, and the like.

The above-described component (f), catalyst, may be selected from any of known catalysts. A platinum-based compound is particularly preferable. Examples thereof include platinum itself, platinum chloride, chloroplatinic acid, olefin-coordinated platinum, and the like. For the purpose of controlling the curing speed of this composition, crossliking suppressing agents such as organopolysiloxanes containing a vinyl group such as tetracyclo (methylvinyl) siloxane or the like, alcohols containing a carbon-carbon triple bond, acetone, methyl ethyl ketone, methanol, ethanol, propylene glycol monomethyl ether, and the like can also be added.

The second layer formed of the radiation-curing type silicone rubber is a film formed by being cured by a radiation-induced crosslinking reaction of a silicone base polymer having a functional group which can be polymerized by being irradiated with radiation.

The film is formed according to the following steps for example: providing a coating solution which is obtained by dissolving a silicone base polymer together with an initiator, applying the coating solution on a substrate, and exposing the whole surface by radiation such that the film is formed as the crossing reaction progresses. Usually, a base polymer having anacrylic functional group is used as the silicone base polymer, and ultraviolet rays are used as the radiation.

Details of such silicone rubbers are described in "R & D Report No. 22: Latest Applied Technology of Silicone" (published by CMC, 1982), Japanese Patent Application Publication (JP-B) No. 56-23150, JP-A No. 3-15553, JP-B No. 5-1934, and the like.

The second layer is coated directly or indirectly (i.e., via another layer) on the first layer.

Thus, in a case where another layer is disposed between the first layer and the second layer, the second layer and another layer is corresponding to upper layers disposed on the first layer.

If necessary, any of the following may be added to the second layer as other components: a fine powder of an inorganic substance such as silica, calcium carbonate, titanium oxide or the like; an adhesion assistant such as a silane coupling agent, titanate-based coupling agent, aluminum-based coupling agent or the like; or a photopolymerization initiator.

The thickness of the second layer is usually from 0.3 to 10 μm, preferably from 0.5 to 5 μm, more preferably from 1 to 3 μm. When the thickness is too small, the ink repelling property deteriorates and scratches tend to be formed. When the thickness is too large, the developing property deteriorates.

In the original plate, various silicone rubber layers may further be coated on the second layer.

Further, for protecting the surface of the second layer, a transparent film formed of, for example, polyethylene, polypropylene, polyvinyl chloride, polyvinylidene chloride, polyvinyl alcohol, polyethylene terephthalate, cellophane or the like, may be laminated on the second layer. Alternatively, a polymer may be coated on the second layer. These films may be used after having been subjected to drawing processing. The surface may be subjected to matte processing. However, in the present invention, it is preferable that matte processing not be carried out.

When the original plate is exposed by laser light, the energy of the laser light is absorbed in the first layer. Then, the first layer which converts light to heat is heated quickly simultaneously with the laser exposure, and a portion of or the entire first layed undergoes a chemical reaction and a physical reaction such as burning, melting, decomposition, vaporization, explosion, or the like. As a result, the adhesion between the second layer which is ink-repellent and the substrate adjacent to the first layer which undergoes the chemical reaction and the like decreases, and the second layer having decreased adhesion to the substrate is peeled and removed. As described above, since the adhesion between the substrate and the second layer decreases only at the regions exposed by laser light, the second layer can be selectively removed in the present invention. Further, in a case where another layer is disposed between the first layer and the second layer, the adhesion between the first layer and upper layers on the first layer (i.e., the second layer and another layer) decreases, and the upper layers are peeled and removed.

(Laser light)

In the present invention, laser light is used for exposure of the original plate. The type of laser which is used is not particularly restricted, provided that it can provide the amount of exposure required to cause a decrease in adhesion which is sufficient for removal of the second layer. Gas lasers such as an Ar laser, carbon dioxide gas laser or the like; solid-state lasers such as a YAG laser or the like; semiconductor lasers, or the like can be used. Usually, a laser having an output of 100 mW or more is required. Among such lasers, semiconductor lasers and solid-state lasers in which a semiconductor is excited (YAG lasers and the like) are suitably used from the view point of practical use such as maintainability, cost and the like.

The recording wavelengths of the laser lights are in the infrared ray wavelength range, and an oscillation wavelength of 800 to 1100 nm is usually utilized. The beam diameter of the laser light is usually from 5 to 200 μm ($1/e^2$).

It is preferable that the laser light is irradiated from the second layer side of the original plate. If the substrate is transparent with respect to the irradiated laser light, irradiation from the substrate side is also possible.

The irradiation of the laser light can also be carried out by using an imaging apparatus described in JP-A 6-186750.

(Automatic treating machine)

In the present invention, the removal of the second layer corresponding to portions exposed by the laser light can be conducted physically by rubbing the surface of the second layer with a rubbing member by using an automatic treating machine equipped with the rubbing member.

Examples of the automatic treating machine are as follows: an automatic treating machine in which an original plate, which has been subjected to laser irradiation, undergoes a rubbing treatment while being transported, as described in JP-A Nos. 2-220061 and 60-59351; and an automatic treating machine in which and original plate, which has been subjected to laser irradiation, is set on a cylinder, and is subjected to a rubbing treatment while the cylinder is rotated, as described in as described in U.S. Pat. Nos. 5,148,746 and 5,568,768, GB Patent No. 2297719, and the like. Among these methods, in particular, an automatic treating machine using a rotating brush roller as the rubbing member is preferable.

Figure 2:
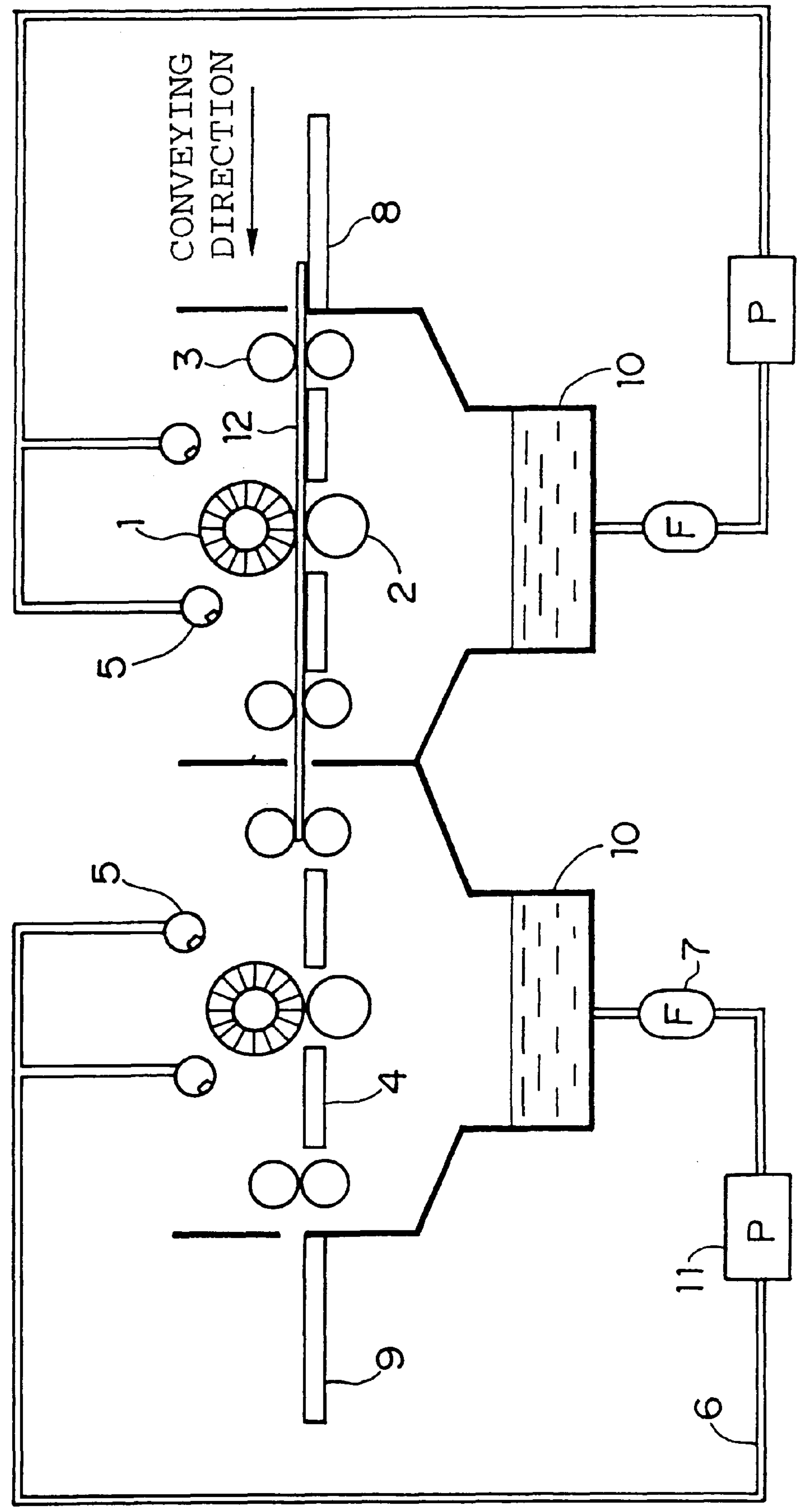
FIG. 2 is a schematic view for explanation of a second embodiment of the method for producing a planographic printing plate of the present invention.

FIGS. 1 and 2 are schematic views illustrating a first embodiment and a second embodiment respectively, in which the method for producing a planographic printing plate of the present invention is carried out by using, automatic treating machines.

The automatic treating machines shown in FIGS. 1 and 2 comprise rotating brush rollers 1 (two rollers are provided in each of FIG. 1 and FIG. 2), receiving rollers 2 (two rollers are provided in each of FIG. 1 and FIG. 2), pairs of conveying rollers 3 (three pairs in FIG. 1, four pairs in FIG. 2), conveying guide plates 4 (four plates are provided in each of FIG. 1 and FIG. 2), spray pipes 5 (four pipes are provided in each of FIG. 1 and FIG. 2), conduit 6, filter 7 (one filter in FIG. 1, two filters in FIG. 2), plate feeding stand 8, plate discharging stand 9, treating solution tank 10, and circulation pumps 11 (one pump in FIG. 1 and two pumps in FIG. 2).

In this automatic treating machine, a planographic printing plate (hereinafter, referred to as "plate 12") which has been exposed by laser light is first conveyed and supplied into the automatic treating machine from the plate feeding stand 8. The plate 12 is conveyed within the automatic treating machine in a state of being nipped by the nip portions of the pairs of conveying rollers 3. In each of the pairs of conveying rollers 3, the respective rollers of the pair rotate in opposite directions. The plate 12, which has been discharged out from the nip portion of the first pair of conveying rollers 3 and conveyed, moves onto the conveying guide plate 4.

At this time, an aqueous solution containing a nonionic surfactant is supplied from the spray pips 5 onto the plate 12. The excess aqueous solution falls downward, and is contained in the treating solution tank 10 provided below the conveying guide 4. The aqueous solution containing the nonionic surfactant, which solution is contained in the treating solution tank 10, is passed through the filter 7 provided on the conduit 6, and is again supplied from the spray pipes 5 onto the printing plate 12 via a pump 11.

Then, the plate 12 passes through the nip portion between the rotating brush roller 1 and the receiving roller 2 which is interlocked with the roller 1. At this time, at the plate 12, portions of the second layer corresponding to laser exposed portions physically removed by a rubbing treatment by the rotating brush roller 1 functioning as a rubbing member. Further, since the aqueous solution containing the nonionic surfactant exists on the plate 12, the ink-repellent layer, i.e., the second layer, is removed extremely efficiently, without problems due to bubbling arising during the rubbing treatment. As a result, the peeled and removed portions of the second layer do not adhere to the portions of the second layer remaining on the plate 2, and an image corresponding to the laser exposure is formed on the plate 12.

In the automatic treating machines shown in FIGS. 1 and 2, since the above-described process is repeated several times (namely, plural rotating brush rollers 1, spray pipes 5 and the like are provided in these automatic treating machines), production of a planographic printing plate is conducted effectively and reliably.

Thus, the produced planographic printing plate can be used in printing as it is, and further, an image having high quality can be formed thereon.

The rotating brush roller can be selected appropriately in accordance with the object and in consideration of the ability to remove the second layer portions corresponding to the laser exposed portions, the tendency to not scratch the surface of the second layer corresponding to the non-exposed portions, the degree of stiffness of the substrate of the original plate, and the like.

The brush roller may be a known brush formed by imbedding a brush material into a plastic or metal roller. Examples include the brushes described in JP-A Nos. 58-159533 and 3-100554; the brush roller disclosed in Japanese Utility Model Application Laid-Open (JU-A) No. 62-167253 which is formed by winding groove shape materials, which are made of metal or plastic into which brush materials have been imbedded in lines, on a plastic or metal roller radially so that no clearance exists; and the like.

Examples of the material used for the brush include plastic fiber, for example, polyester synthetic fiber such as polyethylene terephthalate, polybutylene terephthalate and the like; polyamide synthetic fiber such as nylon 6,6, nylon 6,10 and the like; polyacrylic synthetic fiber such as polyacrylonitrile, alkyl poly(meth)acrylate, and the like; polyolefin synthetic fiber such as polypropylene and polystyrene; and the like.

The diameter of the fiber is suitably from 20 to 400 $\mu$m, and the length thereof is suitably from 5 to 30 mm. The outer diameter of the rotating brush roller is preferably from 30 to 200 mm, and the circumferential speed of the distal ends of the brush rubbing the surface of the second layer is preferably from 0.1 to 5 m/sec.

(Liquid)

In the present invention, liquid is used in rubbing the surface of the original plate to remove portions of the second layer corresponding to the laser-exposed portions. (Hereinafter, this liquid used during rubbing is referred to as the "treating solution".)

However, when the treating solution swells the second layer, the surface of the second layer tends to be scratched since the film strength of the second layer decreases. Therefore, it is preferable to use a liquid which does not swell the second layer as the treating solution.

Examples of liquids which do not swell the second layer are polar solvents such as water, alcohols, and the like. When a polar solvent is used alone, it is not possible to sufficiently prevent re-adhesion of the removed portions of the second layer corresponding to the laser-exposed portions since the ability of the polar solvent to wet the second layer is low. Therefore, in the present invention, a surfactant can be added to the treating solution, in order to improve the ability of the treating solution to wet the second layer. It is advantageous to use an aqueous solution containing a surfactant as the treating solution, from the standpoints of the tendency to not scratch the surface of the second layer portions corresponding to the non-image portions during the rubbing treatment, prevention of re-adhesion of the removed second layer portions corresponding to the laser-exposed portions, and safety.

When an aqueous solution containing a surfactant is used as the treating solution, a solution which generates little bubbling is preferably selected in order to avoid various problems due to bubbling such as the generation of bubbles between the rubbing member and the surface of the plate, the generation of bubbles in a tank containing the treating solution, an increase in the load of a liquid feeding pump, which supplies the treating solution to the rubbing member and the surface of the plate, due to bubbles entering the pump, and the like.

It is preferable that the treating solution in the present invention contains at least a nonionic surfactant, and contains water in an amount of 90% by weight or more in view of safety.

Nonionic surfactant

Examples of the nonionic surfactant which can be used in the treating solution include a higher alcohol ethylene oxide adduct of polyethylene glycol type, alkylphenol ethylene oxide adduct, fatty acid ethylene oxide adduct, polyhydric alcohol fatty ester ethylene oxide adduct, higher alkylamine ethylene oxide adduct, fatty amide ethylene oxide adduct, ethylene oxide adducts of fats and oils, polypropylene glycol ethylene oxide adduct, dimethylsiloxane-ethylene oxide block copolymer, dimethylsiloxane-(propylene oxide-ethylene oxide) block copolymer and the like, fatty ester of glycerol of polyhydric alcohol type, fatty ester of pentaerythritol, fatty esters of sorbitol and sorbitan, fatty ester of sucrose, alkyl ether of polyhydric alcohol, fatty amine of alkanolamines, and the like. A single nonionic surfactant may be used, or a combination of two or more may be used.

In the present invention, among these nonionic surfactants, ethylene oxide adducts of sorbitol and/or sorbitan fatty ester, polypropylene glycol ethylene oxide adduct, dimethylsiloxane-ethylene oxide block copolymer, dimethylsiloxane-(propylene oxide-ethylene oxide) block copolymer, and fatty ester of polyhydric alcohol are more preferable.

The HLB (Hydrophile-Lipophile Balance) value of the nonionic surfactant is preferably from 6 to 15, more preferably from 6 to 13, most preferably from 6 to 11 from the standpoints of stable solubility and turbidity in water and improvement of the ability to wet the second layer.

An amount of the nonionic surfactant contained in the treating solution is from 0.01 to 10% by weight, more preferably from 0.01 to 5% by weight, most preferably from 0.05 to 1% by weight.

When the amount of the nonionic surfactant is less than 0.01% by weight, the ability of the treating solution to wet the surface of the second layer is insufficient, and re-adhesion, onto the surface of the plate, of the removed portions of the second layer (refuse) corresponding to the laser-exposed portions can sometimes not be prevented. On the other hand, when the nonionic surfactant is used in an amount of over 10% by weight, problems may occur due to deterioration in the stability of the aqueous solution and due to bubbling.

In the present invention, for the purpose of improving affinity of the treating solution to the second layer (i.e., the ability of the treating solution to wet the second layer), the treating solution can also contain the following solvents: aliphatic hydrocarbons (hexane, heptane, "Isopar E, H, G" (manufactured by ESSO Chemical K. K.), gasoline, kerosene and the like), aromatic hydrocarbons (toluene, xylene and the like) halogenated hydrocarbons (trichlene and the like), alcohols (methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol and the like), ketones (acetone, methyl ethyl ketone and the like), esters (ethyl acetate, methyl lactate, butyl lactate, propylene glycol monomethyl ether acetate, diethylene glycol acetate, diethyl phthalate and the like), and others (triethyl phosphate, tricresyl phosphate and the like).

Further, in order to suppress bubbling, a known defoaming agent can also be added to the treating solution. As the defoaming agent, a silicone-based defoaming agent is particularly preferable.

Further, alkaline agents (for example, sodium carbonate, diethanolamine, sodium hydroxide and the like) and preservatives (for example, benzoic acid and derivatives thereof, sodium dehydroacetate, 3-isothiazolone compound, 2-bromo-2-nitro-1,3-propanediol, 2-pyridinethiol-1-oxide sodium salt, and the like) can also be added to the treating solution.

The treating solution can be used at any temperature and preferably at from 10 to 50° C.

EXAMPLES

The following examples further illustrate the present invention, but do not limit the scope thereof. (Examples 1 to 10 and Comparative Example 1)

[Formation of first layer]

A 188 μm thick polyethylene terephthalate film whose surface had been subjected to corona treatment (a machine for corona treatment was manufactured by Toyobo Co., Ltd., E5101) was used as a substrate. The following coating liquid was applied onto this substrate so that the thickness after drying was 1 μm, to form the first layer.

Composition of Coating Liquid

| | | |
|---|---|---|
| Carbon black dispersion having the following composition | 55 | g |
| Nitrocellulose (containing 30% 2-propanol, polymerization degree: 80, manufactured by NACALAI TESQUE K. K.) | 4.0 | g |
| Propylene glycol monomethyl ether | 45 | g |

Carbon black dispersion

A mixture having the following composition was dispersed for 30 minutes by a paint shaker, and then, the glass beads were filtered out to prepare a carbon black dispersion.

Composition of Carbon Black Dispersion

| | | |
|---|---|---|
| Carbon black (manufactured by Mitsubishi Chemical Corp., #40) | 5.0 | g |
| Polyurethane (manufactured by Dainippon Ink & Chemicals. Inc., CRISVON 3006 LV) | 4.0 | g |
| Nitrocellulose (Containing 30% 2-propanol, polymerization degree: 80, manufactured by NACALAI TESQUE K. K.) | 1.3 | g |
| Dispersing agent (manufactured by ICI, Solsperse S 27000) | 0.4 | g |
| Propylene glycol monomethyl ether | 45 | g |
| Glass beads | 160 | g |

[Formation of second layer]

A coating liquid having the following composition was prepared, applied onto the first layer, heated (at 110° C. for 1 minute), and dried so as to form a silicone rubber layer (second layer) having a thickness after drying of 2 μm.

Composition of Coating Liquid

| | | |
|---|---|---|
| α,ω-Dihydroxypolydimethylsiloxane (polymerization degree: about 900) | 9.00 | g |
| Methyltriacetoxysilane | 1.00 | g |
| Dimethyldiacetoxysilane | 1.00 | g |
| Tin octylate dibutyl | 0.01 | g |
| Aliphatic hydrocarbon | 120 | g |

A polypropylene film having a thickness of 12 μm was laminated on the surface of the silicone rubber layer obtained as described above.

The cover film of the resulting original plate was peeled off. Then, a semiconductor laser, which had an output of 110 mW, a wavelength of 830 nm and a beam diameter of 10 μm ($1/e^2$), was applied from the side of the second layer, and writing of 200 lines of dots was conducted.

Then, an automatic treating machine having two rotating brush rollers having the same mechanism as in FIG. 1 was used to remove the portions of the second layer corresponding to the laser-irradiated portions.

A first rotating brush roller and a second rotating brush roller were used. The first rotating brush roller was a brush roller formed by the imbedding of polybutylene terephthalate fibers (diameter of each fiber: 200 μm, length of each fiber: 17 mm) such that the brush roller had an outer diameter of 90 mm. This first brush roller was rotated at 400 rpm (the circumferential speed at the distal ends of the brushes was 1.9 m/sec) in the same direction as the direction of conveying the plate. The second rotating brush roller was a brush roller formed by the imbedding of polybutylene terephthalate fibers (diameter of each fiber: 200 μm, length of each fiber: 17 mm) such that the brush roller had an outer diameter of 60 mm. This second brush roller was rotated at 300 rpm (the circumferential speed at the distal ends of the brushes was 0.9 m/sec) in the direction opposite to the direction of conveying the plate.

The original plate was conveyed at a conveying speed of 100 cm/min.

The treating solution used in removing the second layer had the following composition shown in following Table 1, and was supplied to the surface of the plate by being showered from a spray pipe by using a circulation pump. For each treating solution, 20 original plates were subjected to treatment in succession. Then, the entry, into the circulation pump of bubbles generated in the treating solution tank, and the solution stability of the treating solution were evaluated.

Next, the waterless planographic plate obtained by the above-described treatment was printed by using a printing machine. After printing, the dot area ratio (%) of reproducible highlight and the lack of ink at the image portions due to the re-adhesion of the refuse of the removed second layer were evaluated.

The results are shown in following Table 2.

TABLE 1

| | Composition of treating solution (% by weight) | | |
|---|---|---|---|
| | Tween 81*1 | Pluronic K62*2 | Water |
| Example 1 | 0.001 | — | 99.999 |
| Example 2 | 0.05 | — | 99.95 |
| Example 3 | 0.2 | — | 99.8 |
| Example 4 | 0.8 | — | 99.2 |
| Example 5 | 15 | — | 85 |
| Example 6 | — | 0.001 | 99.999 |
| Example 7 | — | 0.05 | 99.95 |
| Example 8 | — | 0.5 | 99.5 |
| Example 9 | — | 1 | 99 |
| Example 10 | — | 12 | 88 |
| Comparative Example 1 | — | — | 100 |

*1Tween 81: manufactured by Kao Atlas Corp. Polyoxyethylene sorbitan monooleate (HLB = 10.0)

*2Pluronic L62: manufactured by Asahi Denka Kogyo K. K. Polypropylene glycol ethylene oxide adduct (HLB = 6.3)

TABLE 2

| | Entry of bubbles into circulation pump | Solution stability of treating solution | Reproducibility of highlight | Lack of ink at image portions |
|---|---|---|---|---|
| Example 1 | ○ None | ○ Turbid | 2 | Δ Extremely slight |
| Example 2 | ○ None | ○ Turbid | 2 | ○ None |
| Example 3 | ○ None | ○ Turbid | 2 | ○ None |
| Example 4 | ○ None | ○ Turbid | 2 | ○ None |
| Example 5 | Δ Extremely slight | Δ Partial phase separation | 3 | ○ None |
| Example 6 | ○ None | ○ Dissolved, Transparent | 2 | Δ Extremely slight |
| Example 7 | ○ None | ○ Dissolved, Transparent | 2 | ○ None |
| Example 8 | ○ None | ○ Dissolved, Transparent | 2 | ○ None |
| Example 9 | ○ None | ○ Dissolved, Transparent | 3 | ○ None |

TABLE 2-continued

| | Entry of bubbles into circulation pump | | Solution stability of treating solution | | Reproducibility of highlight | Lack of ink at image portions | |
|---|---|---|---|---|---|---|---|
| Example 10 | Δ | Extremely slight | ○ | Dissolved, Transparent | 3 | ○ | None |
| Comparative Example 1 | ○ | None | ○ | | 2 | X | Some |

(Examples 11 to 13 and Comparative Examples 2 to 5)

[Substrate]

A coating solution having the following composition was applied onto a 188 pm thick polyethylene terephthalate film, heated (at 110° C. for 1 minute), and dried, to form a primer layer having a thickness after drying of 0.2 $\mu$m.

Composition of Primer Layer Coating Solution

| | | |
|---|---|---|
| Chlorinated polyethylene | 1.0 | g |
| $-(-C_2H_4-yCly-)n-$, wherein y = 1.7 and n = 200 | | |
| Methyl ethyl ketone | 10 | g |
| Cyclohexane | 100 | g |

[Formation of first layer]

On the primer layer applied onto the polyethylene terephthalate substrate, titanium was deposited by resistance heating under the condition of a degree of vacuum of $5\times10^{-5}$ Torr, so as to form the first layer. The thickness of this first layer was 200 Å, and the optical density thereof was 0.6.

[Preparation of second layer]

A coating solution having the following composition was prepared, applied onto the first layer, heated (at 110° C. for 2 minutes), and dried, to form the second layer having a thickness after drying of 2 $\mu$m. The original plate for laser recording was thus obtained.

Composition of Second Layer Coating Solution

| | | |
|---|---|---|
| α,ω-Divinylpolydimethylsiloxane (polymerization degree: about 700) | 9.00 | g |
| $(CH_3)_3-Si-O-(SiH(CH_3)-O)_8-Si(CH_3)_3$ | 0.60 | g |
| Polydimethylsiloxane (polymerization degree: about 8,000) | 0.50 | g |
| Olefin-chloroplatinic acid | 0.08 | g |
| Suppressing agent $[HC\equiv C-C(CH_3)_2-O-Si(CH_3)_3]$ | 0.07 | g |
| Aliphatic hydrocarbon | 55 | g |

Treatment of the original plate (production of the planographic plate) and printing (printing using the planographic plate) were conducted in the same manner as in Example 1 except that the treating solution shown in following Table 3 was used. The results are shown in following Table 4.

TABLE 3

| | Composition of treating solution (% by weight) | |
|---|---|---|
| Example 11 | DBE 712 (manufactured by Chisso K. K., dimethylsiloxane-ethylene oxide block copolymer) | 0.3 |
| | Water | 99.7 |
| Example 12 | Emulgen 105 (manufactured by Kao Atlas Corp., polyoxyethylene lauryl ether, HLB = 9.7) | 0.1 |
| | Water | 99.9 |
| Example 13 | Rheodol 430 (manufactured by Kao Atlas Corp., tetraoleic acid polyoxyethylene sorbit, HLB = 10.5) | 0.2 |
| | Water | 99.8 |
| Example 14 | DK ESTER F10 (manufactured by Dai-ichi Kogyo Seiyaku Co., Ltd., fatty acid of sucrose, HLB = 11) | 3 |
| | Water | 97 |
| Example 15 | Emulgen 911 (manufactured by Kao Atlas Corp., polyoxyethylene nonylphenol ether, HLB = 13.7) | 0.05 |
| | isopropyl alcohol | 5 |
| | Water | 94.95 |
| Comparative Example 2 | Pellex NB-L (manufactured by Kao Atlas Corp., sodium alkylnaphthalenesulfonate) | 0.5 |
| | Water | 99.5 |
| Comparative Example 3 | Pellex OT-P (manufactured by Kao Atlas Corp., sodium dialkysulfosuccinate | 0.5 |
| | Water | 99.5 |
| Comparative Example 4 | Acetamine 24 (manufactured by Kao Atlas Corp., laurylamine acetate) | 0.5 |
| | Water | 99.5 |
| Comparative Example 5 | Coatamine 24P (manufactured by Kao Atlas Corp., lauryltrimethylammonium chloride) | 0.5 |
| | Water | 99.5 |

TABLE 4

| | Entry of bubbles into circulation pump | | Solution stability of treating solution | | Reproducibility of highlight | Lack of ink at image portions | |
|---|---|---|---|---|---|---|---|
| Example 11 | ○ | None | ○ | Dissolved, Transparent | 3 | ○ | None |
| Example 12 | ○ | None | ○ | Turbid | 2 | ○ | None |
| Example 13 | ○ | None | ○ | Turbid | 2 | ○ | None |
| Example 14 | ○ | None | ○ | Dissolved, Transparent | 2 | ○ | None |
| Example 15 | ○ | None | ○ | Dissolved, Transparent | 2 | ○ | None |
| Comparative Example 2 | X | Some | ○ | Dissolved, Transparent | 3 | ○ | None |
| Comparative Example 3 | X | Some | ○ | Dissolved, Transparent | 3 | ○ | None |
| Comparative Example 4 | X | Some | ○ | Dissolved, Transparent | 3 | ○ | None |
| Comparative Example 5 | X | Some | ○ | Dissolved, Transparent | 3 | ○ | None |

What is claimed is:

1. A method for producing a planographic printing plate comprising the steps of:

providing an original planographic printing plate which comprises a substrate, and a first layer and an ink-repellent layer having an ink-repellent surface in that order on said substrate, wherein the first layer converts laser light to heat and enables peeling of upper layers disposed on said first layer;

exposing said original planographic printing plate by laser light; and rubbing the surface of said original planographic printing plate, which is the surface of said ink-repellent layer, with a rubbing member in the presence of an aqueous solution consisting essentially of a nonionic surfactant to physically remove laser-exposed portions of said ink-repellent layer, thereby forming the planographic plate.

2. The method according to claim 1, wherein the aqueous solution consisting essentially of a nonionic surfactant contains water in an amount of 90% by weight or more.

3. The method according to claim 1, wherein an amount of the nonionic surfactant in the aqueous solution is from 0.01 to 5% by weight.

4. The method according to claim 1, wherein the HLB (Hydrophile-Lipophile Balance) value of the nonionic surfactant is from 6 to 13.

5. The method according to claim 1, wherein the nonionic surfactant is selected from the group consisting of ethylene oxide adducts of sorbitol fatty ester, ethylene oxide adducts of sorbitan fatty ester, polypropylene glycol ethylene oxide adduct, dimethylsiloxane-(propylene oxide-ethylene oxide) block copolymer, and fatty ester of polyhydric alcohol.

* * * * *